(12) United States Patent
Oka et al.

(10) Patent No.: US 8,743,673 B2
(45) Date of Patent: Jun. 3, 2014

(54) LIGHT SOURCE DEVICE, OPTICAL PICKUP, AND RECORDING DEVICE

(75) Inventors: Michio Oka, Tokyo (JP); Hiroshi Yoshida, Kanagawa (JP); Kenji Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/464,539

(22) Filed: May 4, 2012

(65) Prior Publication Data

US 2012/0307620 A1    Dec. 6, 2012

(30) Foreign Application Priority Data

May 30, 2011    (JP) .................................. 2011-120501

(51) Int. Cl.
G11B 7/135    (2012.01)

(52) U.S. Cl.
USPC ...................................... 369/112.27; 369/121

(58) Field of Classification Search
None
See application file for complete search history.

(56) References Cited

U.S. PATENT DOCUMENTS

| | | | | |
|---|---|---|---|---|
| 4,972,422 A * | 11/1990 | Tatsuno | | 372/22 |
| 5,080,507 A * | 1/1992 | Harada et al. | | 385/122 |
| 5,469,454 A * | 11/1995 | Delfyett, Jr. | | 372/18 |
| RE35,215 E * | 4/1996 | Waarts et al. | | 372/108 |
| 5,608,743 A * | 3/1997 | Hayakawa | | 372/20 |
| 5,719,976 A * | 2/1998 | Henry et al. | | 385/50 |
| 5,799,024 A * | 8/1998 | Bowers et al. | | 372/11 |
| 6,021,141 A * | 2/2000 | Nam et al. | | 372/20 |
| 6,028,722 A * | 2/2000 | Lang | | 359/834 |
| 6,288,833 B1 * | 9/2001 | Kasamatsu | | 359/333 |
| 7,366,421 B2 * | 4/2008 | Cho et al. | | 398/142 |
| 7,466,736 B2 * | 12/2008 | Hamamoto et al. | | 372/43.01 |
| 7,646,546 B1 * | 1/2010 | O'Shaughnessy et al. | | 359/669 |
| 8,284,635 B2 * | 10/2012 | Matsumoto | | 369/13.33 |
| 2002/0071463 A1 * | 6/2002 | Garnache et al. | | 372/45 |
| 2002/0154393 A1 * | 10/2002 | Hamamoto | | 359/344 |
| 2003/0021319 A1 * | 1/2003 | Aoki | | 372/46 |
| 2003/0185256 A1 * | 10/2003 | Aoki | | 372/20 |
| 2005/0180302 A1 * | 8/2005 | Tamada | | 369/275.1 |
| 2006/0165138 A1 * | 7/2006 | Kachanov et al. | | 372/21 |
| 2007/0133638 A1 * | 6/2007 | Mizuuchi et al. | | 372/50.11 |
| 2007/0223549 A1 * | 9/2007 | Livshits et al. | | 372/45.01 |
| 2011/0170381 A1 * | 7/2011 | Matsumoto | | 369/13.33 |

OTHER PUBLICATIONS

Tashiro et al., "Volumetric Optical Recording Using a 400nm All-Semiconductor Picosecond Laser," The Japan Society of Applied Physics, Applied Physics Express, vol. 3, 2010, pp. 102501-1 through 02501-3. (3 pages).

* cited by examiner

Primary Examiner — Peter Vincent Agustin
(74) Attorney, Agent, or Firm — K&L Gates LLP

(57) ABSTRACT

A light source device configured as a master oscillator power amplifier includes a mode locked laser unit having an external resonator and a semiconductor optical amplifier that amplifies and modulates laser light emitted from the mode locked laser unit. The width in a lateral direction of a waveguide on an incident side of the semiconductor optical amplifier is set so that a horizontal lateral mode of the waveguide on the incident side of the semiconductor optical amplifier becomes multiple modes, and a magnification conversion unit that converts a magnification of incident light from the mode locked laser unit to the semiconductor optical amplifier is disposed so that a basic mode is selectively excited in optical coupling on the incident side of the semiconductor optical amplifier.

7 Claims, 22 Drawing Sheets

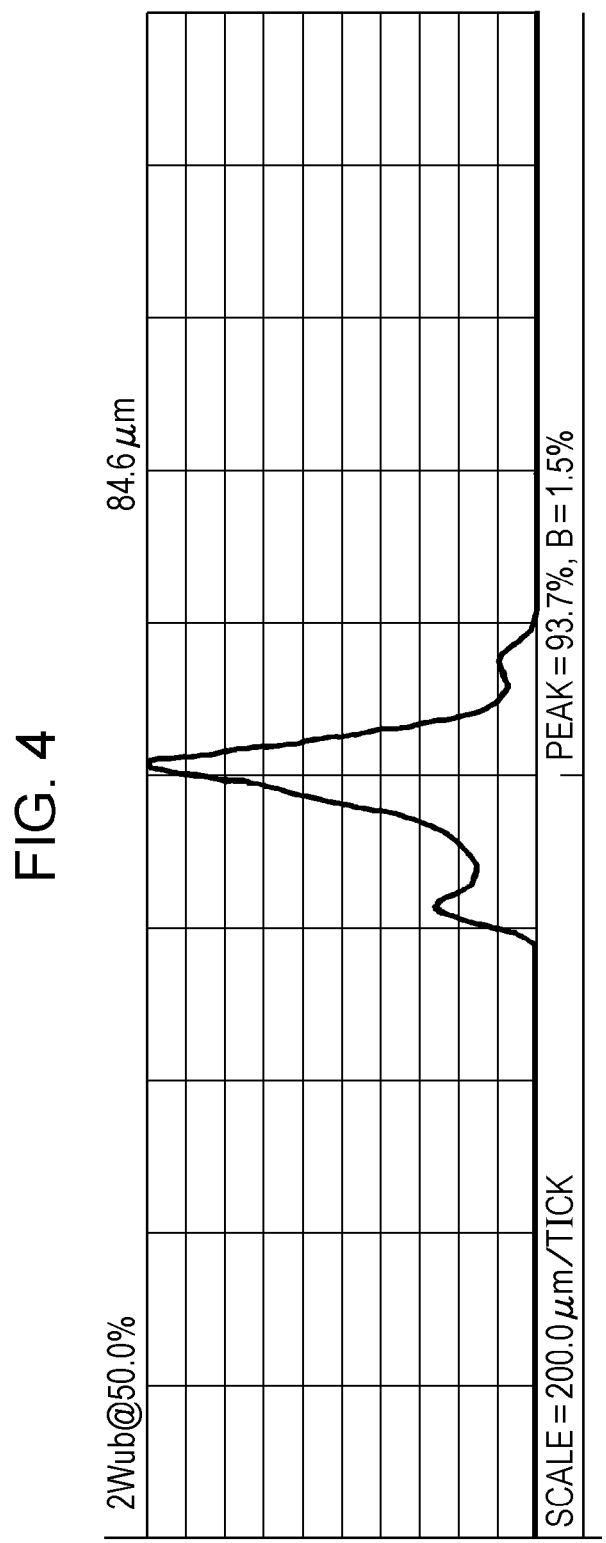

(HORIZONTAL AXIS 2 nm/TICK)

(HORIZONTAL AXIS 2 nm/TICK)

REGION OF WAVEFRONT VARIATION DUE TO
NONLINEAR EFFECT AND THERMAL EFFECT

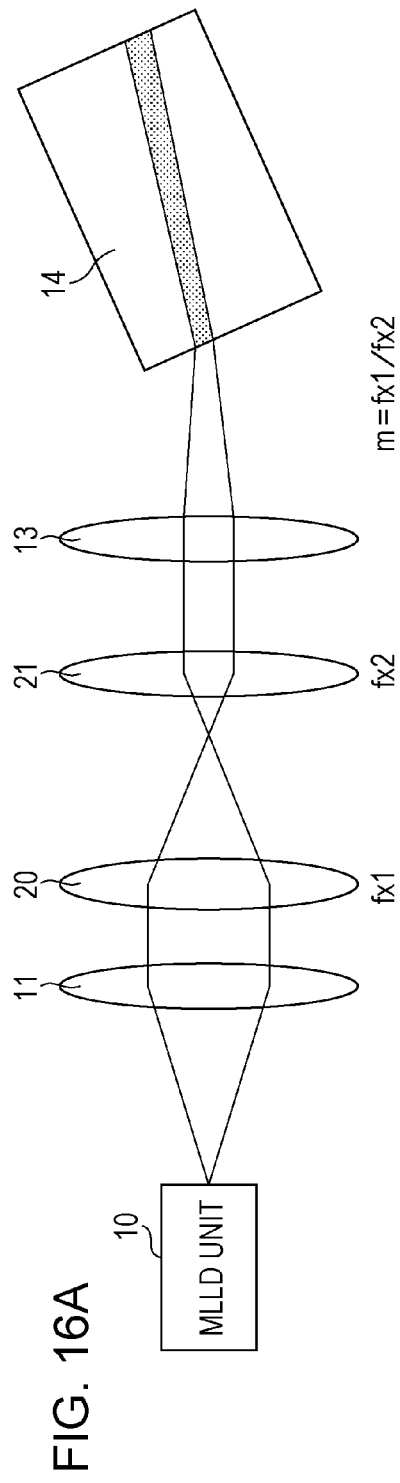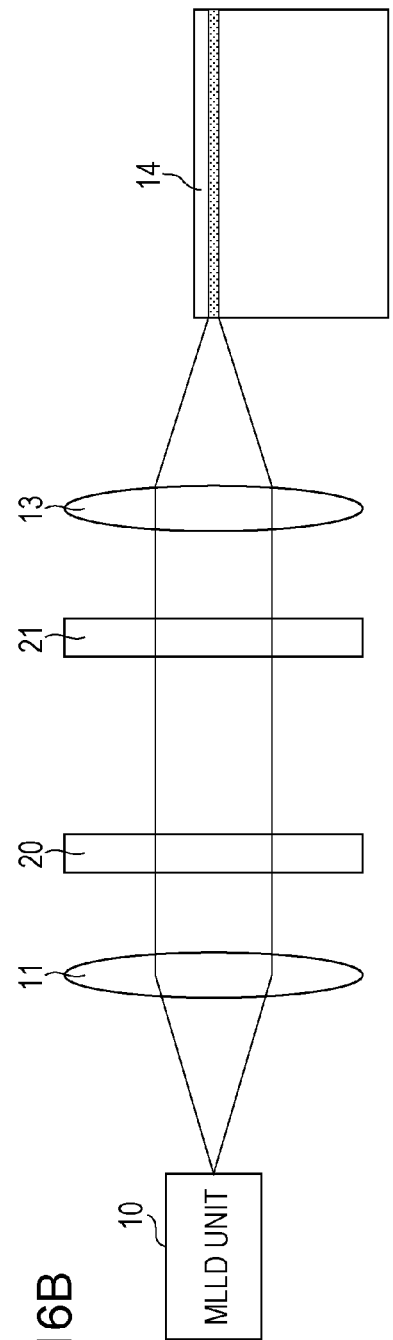
FIG. 16A
FIG. 16B

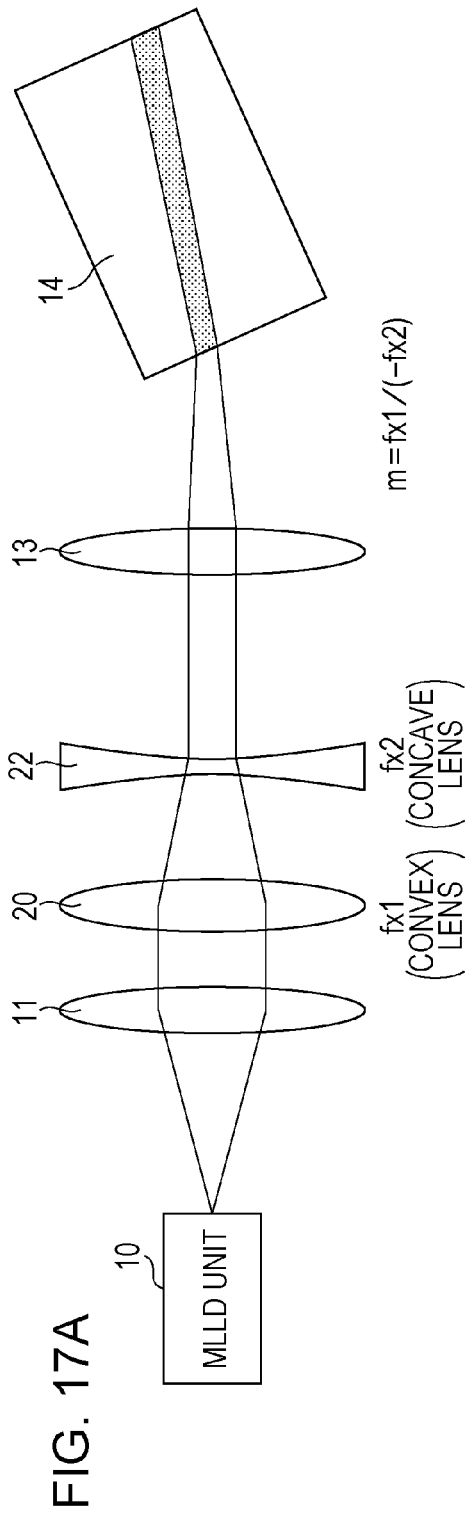
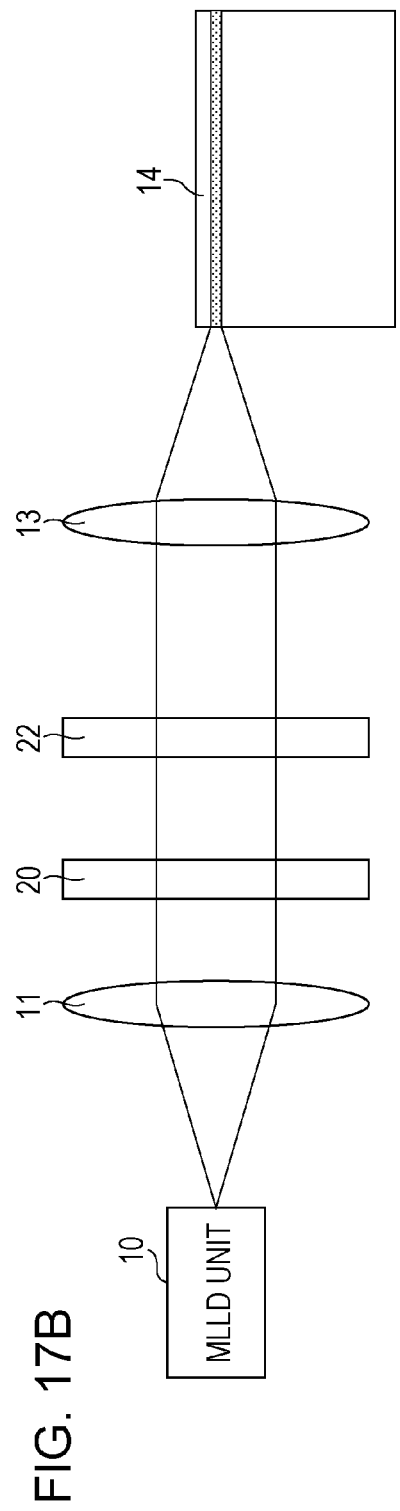

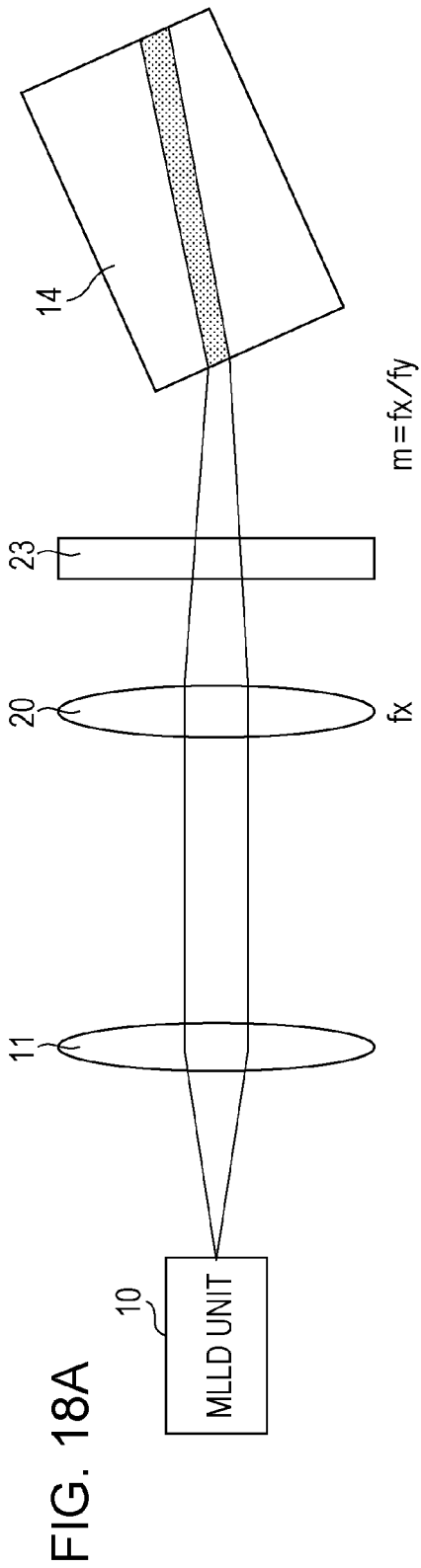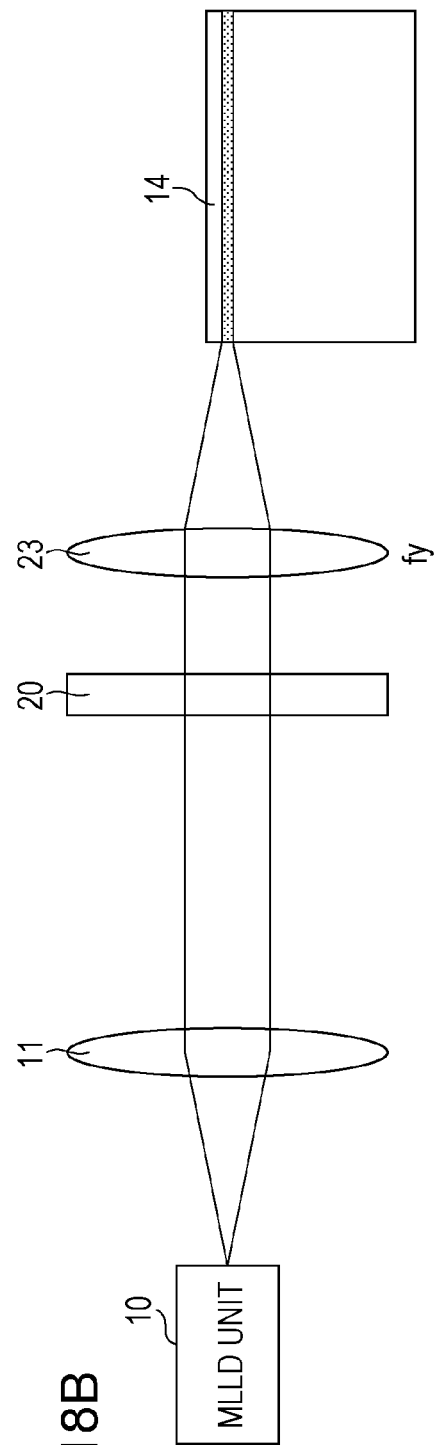
FIG. 18A
FIG. 18B

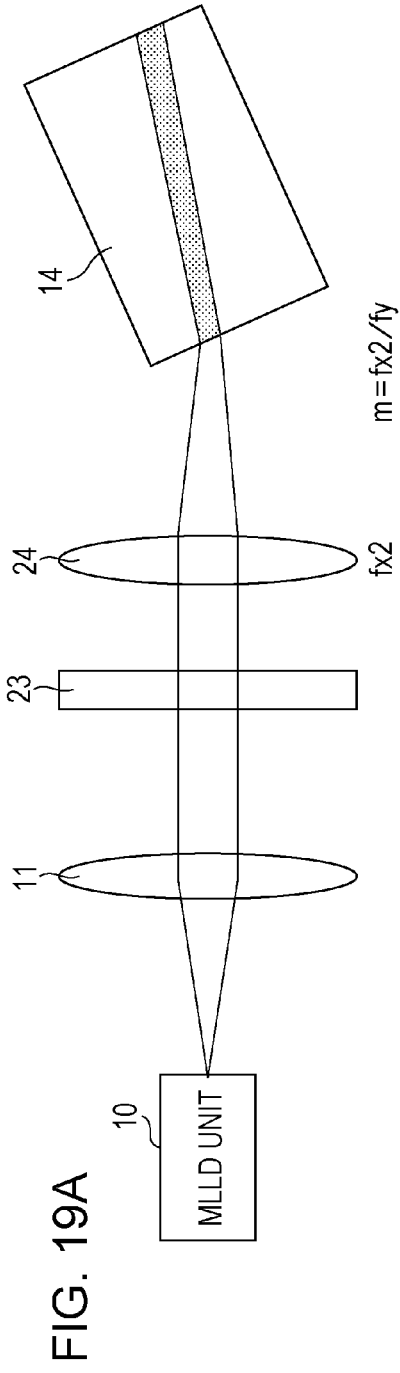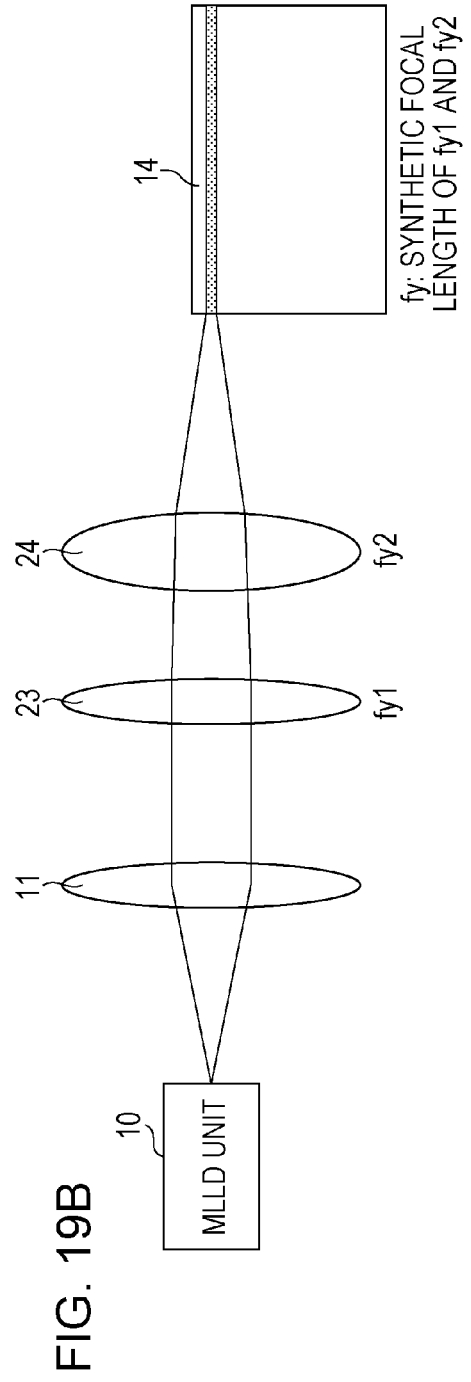

LIGHT SOURCE DEVICE, OPTICAL PICKUP, AND RECORDING DEVICE

CROSS REFERENCES TO RELATED APPLICATIONS

The present application claims priority to Japanese Priority Patent Application JP 2011-120501 filed in the Japan Patent Office on May 30, 2011, the entire content of which is hereby incorporated by reference.

BACKGROUND

The present application relates to a light source device configured as a MOPA (master oscillator power amplifier) in which a mode-locked laser and a semiconductor optical amplifier are combined. It also relates to an optical pickup and recording device that use a MOPA as a light source for recording on an optical recording medium.

An example of a pulse laser that achieves a relatively high repetition frequency such as hundreds of megahertz or several gigahertz includes a MOPA (master oscillator power amplifier) that uses an MLLD (mode locked laser diode) as the master laser and amplifies and modulates its optical output with an SOA (semiconductor optical amplifier).

A structure in which input light from a master laser is amplified and modulated by an SOA was mainly adopted in the optical communication field.

In optical communication, light to be input or output is transferred through an optical fiber.

In this case, especially in a backbone communication system, use of single mode fibers is specified by communication standards of, for example, ITU (International Telecommunication Union). Accordingly, waveguides for an SOA are often designed for single mode on the incident side. For actual products, in a semiconductor optical amplifier (semiconductor optical module) in which a semiconductor and an optical fiber are integrally packaged, connection with a single mode fiber is made as in Alphion products. Accordingly, the waveguide of a semiconductor optical amplifier is designed for single mode.

Designing of a waveguide for single mode in response to an input by a single mode fiber is obvious from the mode coupling theory (see "Lightwave Optics" by Yasuo Kokubun, Kyoritsu Shuppan).

$$|Ein> = \Sigma_i C_i |\phi i> + \Sigma_j D_j |\phi j> \quad (1)$$

where Ein is incident electric field, Φi is the waveguide mode of the waveguide at the input end of the semiconductor, and φj is the emission mode of the waveguide at the input end of the semiconductor.

$$Ci = <\phi i|Ein> \quad (2)$$

$$Di = <\phi j|Ein> \quad (3)$$

where i and j are mode numbers. In addition, the following expressions hold because of its orthogonality.

$$<\phi i|\phi k> = \delta ik \quad (4)$$

$$<\phi i|\phi k> = \delta ik \quad (5)$$

$$<\phi i|\phi j> = 0 \quad (6)$$

In addition, the following expression holds.

$$<a|b> = \int_{-\infty}^{\infty} dx \int_{-\infty}^{\infty} dy\, a(x,y)^* b(x,y) \quad (7)$$

In recent years, the applicant has proposed optical recording systems that use a MOPA as a recording light source (see, for example, Applied Physics Express 3 (2010) 102501 "Volumetric Optical Recording Using a 400 nm All-Semiconductor Picosecond Laser" Shiori Tashiro, Yoshihiro Takemoto, Hisayuki Yamatsu, Takahiro Miura, Goro Fujita, Takashi Iwamura, Daisuke Ueda, Hiroshi Uchiyama, Kyung-Sung Yun, Masaru Kuramoto, Takao Miyajima, Masao Ikeda, and Hiroyuki Yokoyama, Storage & Memory Business Development Division, Core Device Development Group, Sony).

The MOPA proposed in the above cited document "Volumetric Optical Recording Using a 400 nm All-Semiconductor Picosecond Laser" achieves a peak power of approximately 100 W at a wavelength of approximately 405 nm, a repetition frequency of approximately 1 GHz, and a pulse width of approximately 4 picoseconds.

For confirmation, the structure of a MOPA used in an optical recording system will be described with reference to FIG. 20.

In FIG. 20, the MOPA has an MLLD unit 100 and an SOA 107. The MLLD unit 100 includes an MLLD 101 as a semiconductor laser and an external resonator (including a focusing lens 102, a band pass filter 103, and a resonant mirror 104) and emits a pulsed laser light (master laser light) with a predetermined repetition frequency.

Exit light from the MLLD unit 100 is collimated by a collimation lens 105 and the collimated light is focused by the focusing lens 106 on the incident end (entrance) of the SOA 107. The laser light incident through the focusing lens 106 is amplified and modulated by the SOA 107 and then output. The master laser light from the MLLD unit 100 is modulated by this SOA 107 in response to data to be recorded and then output.

Also in the MOPA used in this type of optical recording system, the lateral mode (horizontal lateral mode) of the waveguide on an incident side on the SOA 107 is designed for single mode, as in the optical communication field. In other words, the waveguide of the related-art SOA 107 has a structure that guides only single mode, that is, basic mode.

Accordingly, in the related-art MOPA, the output waveguide of the MLLD 101 and the input waveguide of the SOA 107 were designed to have the same dimension (same width) for efficient single mode optical coupling.

SUMMARY

However, particularly in the case where optical output of relatively-high power is achieved as in the MOPA described in the above cited document "Volumetric Optical Recording Using a 400 nm All-Semiconductor Picosecond Laser", it was found that, if the output waveguide of the MLLD 101 and the input waveguide of the SOA 107 are configured to have the same width for single mode coupling, a plurality of peaks instead of a single peak appear in the light intensity distribution in the horizontal lateral direction of output light from the SOA 107.

FIG. 21 shows a near-field image of the beam profile on exit side of the SOA 107 in the MOPA described in the above cited document "Volumetric Optical Recording Using a 400 nm All-Semiconductor Picosecond Laser"; FIG. 22A shows the light intensity distribution in the horizontal lateral direction of the exit light from the SOA 107; FIG. 22B shows a section of the waveguide on the exit side of the SOA 107.

From FIG. 21 and FIGS. 22A and 22B, it is found that, in the MOPA described in the above cited document "Volumetric Optical Recording Using a 400 nm All-Semiconductor Picosecond Laser", the light intensity distribution in the horizontal lateral direction of the output light from the SOA 107 has three peaks: one in the middle and the others on both sides of the peak in the middle.

The reason why more than one peak appears is because light leaks from the waveguide in the SOA 107.

This is also apparent from the fact that the positions of the two outer peaks appear outside the waveguide on the exit side of the SOA 107 in FIGS. 22A and 22B.

In a more detailed study, it was also found that the position of the peak in the middle of the waveguide varies unstably over time.

The optical recording system preferably has a small distribution of light amounts in the spot to obtain good recording performance. Accordingly, it is desirable that only one peak appears in the intensity distribution of output light from the SOA 107.

In addition, above-described variations in the peak position should be suppressed to keep stable recording performance.

It is desirable to obtain an optical device with good and stable performance by ensuring that only one peak appears in an exit beam from the MOPA and suppressing variations in the peak position.

For these purposes, a light source device according to an embodiment of the present application is configured as described below.

A light source device according to an embodiment of the present application configured as a MOPA (master oscillator power amplifier) includes a mode locked laser unit having an external resonator and a semiconductor optical amplifier that amplifies and modulates laser light emitted from the mode locked laser unit in which the width in a lateral direction of a waveguide on an incident side of the semiconductor optical amplifier is set so that a horizontal lateral mode of the waveguide on the incident side of the semiconductor optical amplifier becomes multiple modes.

In addition to this, a magnification conversion unit that converts a magnification of incident light from the mode locked laser unit to the semiconductor optical amplifier is disposed so that a basic mode is selectively excited in optical coupling of the incident side of the semiconductor optical amplifier.

As described above, in the embodiment of this application, the width in the lateral direction of a waveguide on the incident side of the semiconductor optical amplifier is set so that the horizontal lateral mode of waveguide on the incident side of the semiconductor optical amplifier becomes multiple modes. In other words, the width in the lateral direction of the waveguide on the incident side of the semiconductor optical amplifier is set to become larger than the width in the lateral direction of the waveguide on the exit side of the mode locked laser. This improves the light confinement in the basic mode defined by the width of the waveguide on the incident side of the semiconductor optical amplifier and ensures that only one peak appears in the intensity distribution of the output light when the semiconductor optical amplifier emits light on a stand-alone basis.

In addition, the embodiment of this application allows the magnification conversion unit to selectively excite the basic mode (single mode) in optical coupling on the incident side of the semiconductor optical amplifier. Accordingly, it is possible that only one peak appears in the intensity distribution of light finally output from the entire MOPA, or exit light from the semiconductor optical amplifier after optical coupling with the mode locked laser unit.

The conversion of the magnification of incident light from the mode locked laser unit as described above means the enlargement of the spot size of incident light from the mode locked laser unit to the semiconductor optical amplifier. This reduces the light density in the waveguide of the semiconductor optical amplifier. As a result, variations in the peak of the exit beam, caused by nonlinear optical effects (self-phase modulation) of the semiconductor optical amplifier as described later, can be suppressed.

According to the embodiment of the present application, it is possible that only one peak appears in the exit beam of the light source device including the MOPA and to suppress variations in the peak position. This achieves good and stable performance as an optical device, particularly as a recording device for optical recording.

Additional features and advantages are described herein, and will be apparent from the following Detailed Description and the figures.

BRIEF DESCRIPTION OF THE FIGURES

FIG. 4 shows a lateral direction beam profile on the exit side of the SOA of the related art in a state in which optical coupling with a master laser is not made.

Figure 11A:
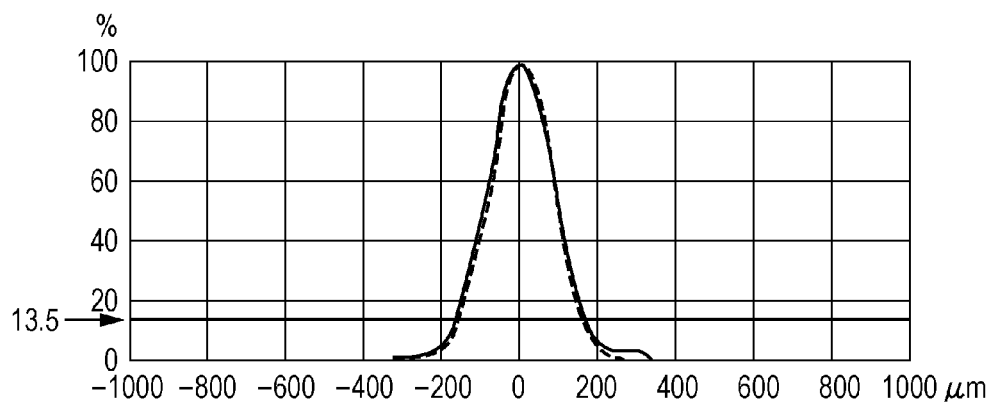
Figure 11B:
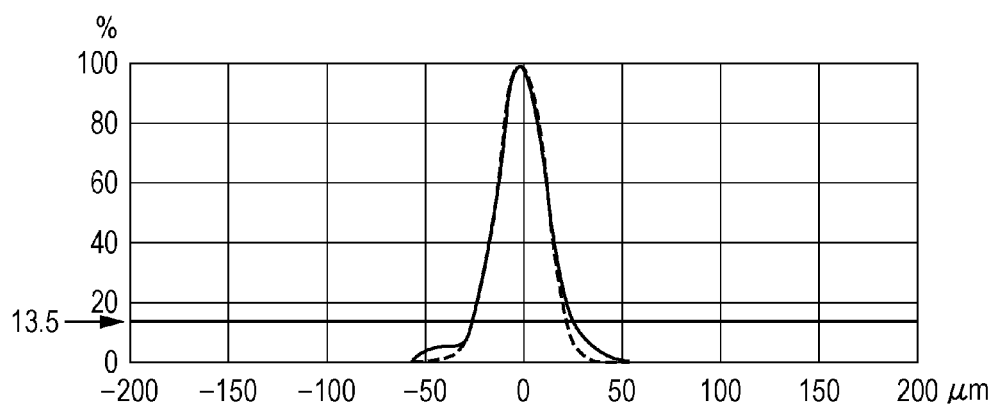

Each of FIGS. 11A and 11B shows the beam profile of a near-field image on the exit side of the SOA when magnification conversion has been performed.

Figure 12:
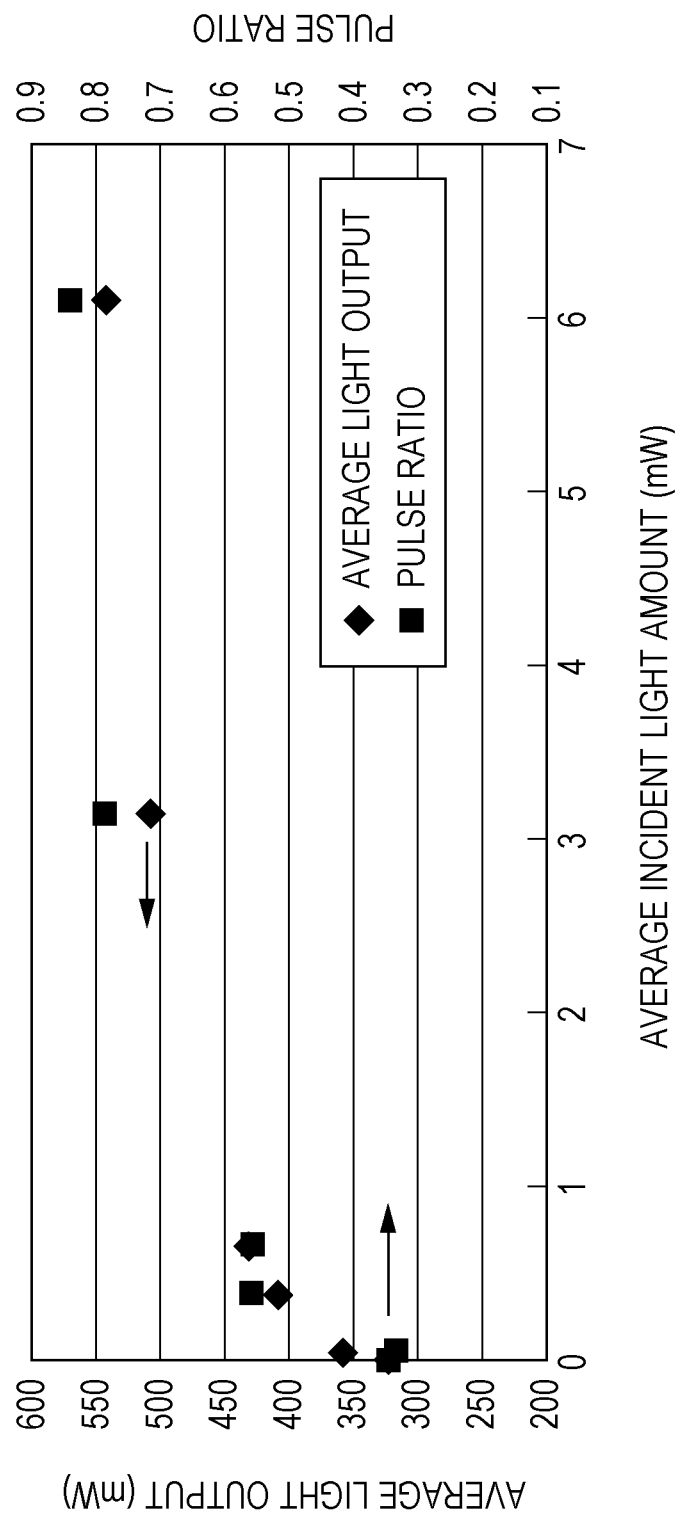

FIG. 12 shows the amplification ratio of the SOA of the related art to the input light intensity of the master laser when using the SOA.

Figure 13A:
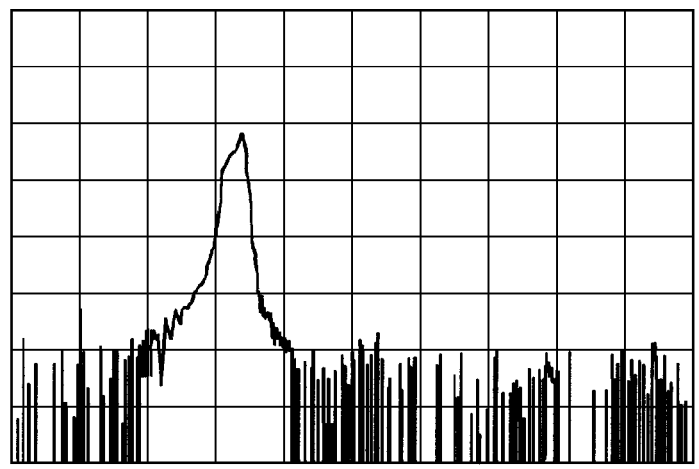
Figure 13B:
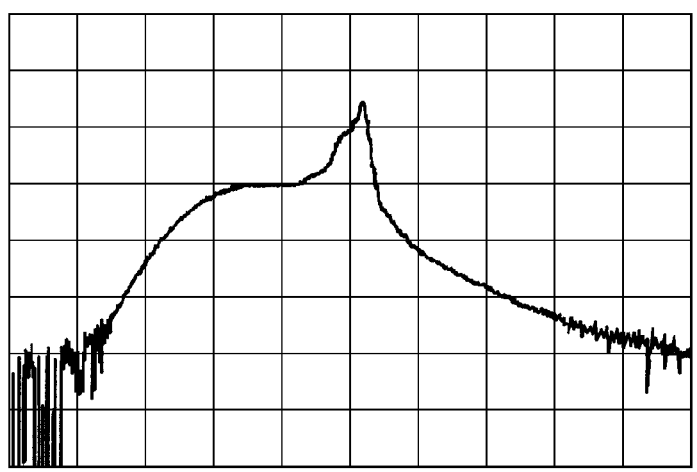

FIG. 13A shows the optical spectrum of the master laser light of the SOA of the related art;

FIG. 13B shows the optical spectrum on the exit side of the SOA.

Figure 14A:
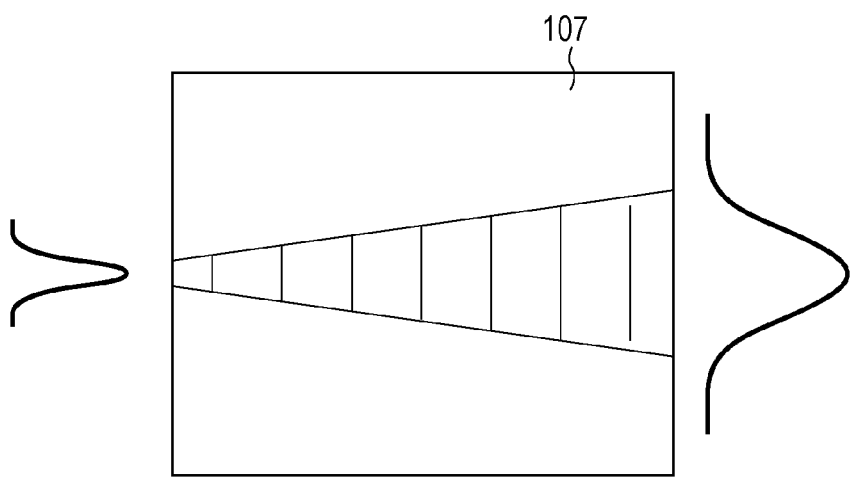
Figure 14B:
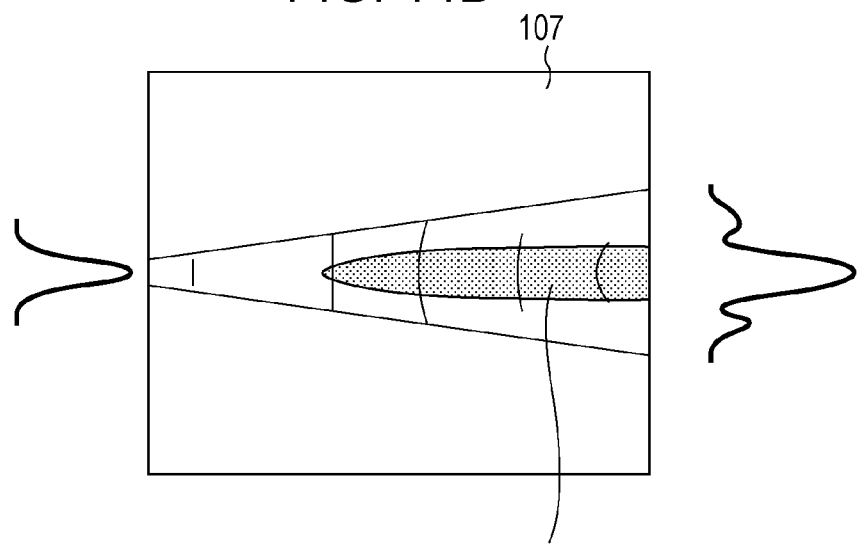

FIGS. 14A and 14B show wavefront aberration caused by nonlinear effects and thermal effects.

Figure 15A:
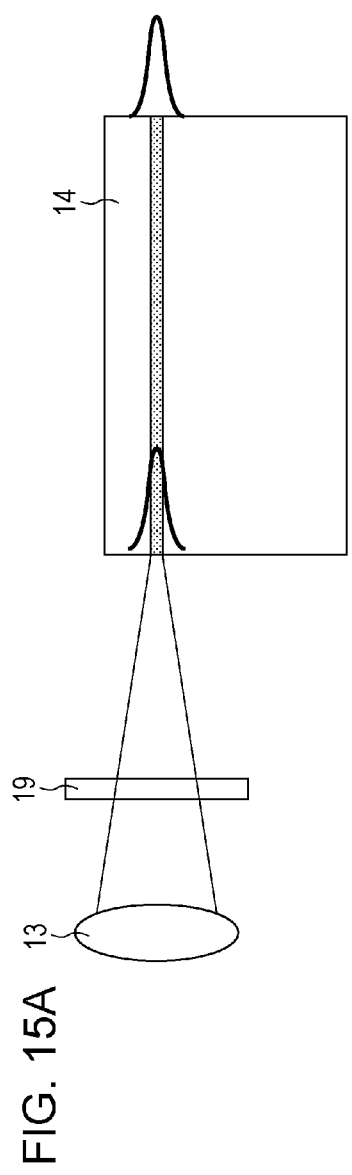
Figure 15B:
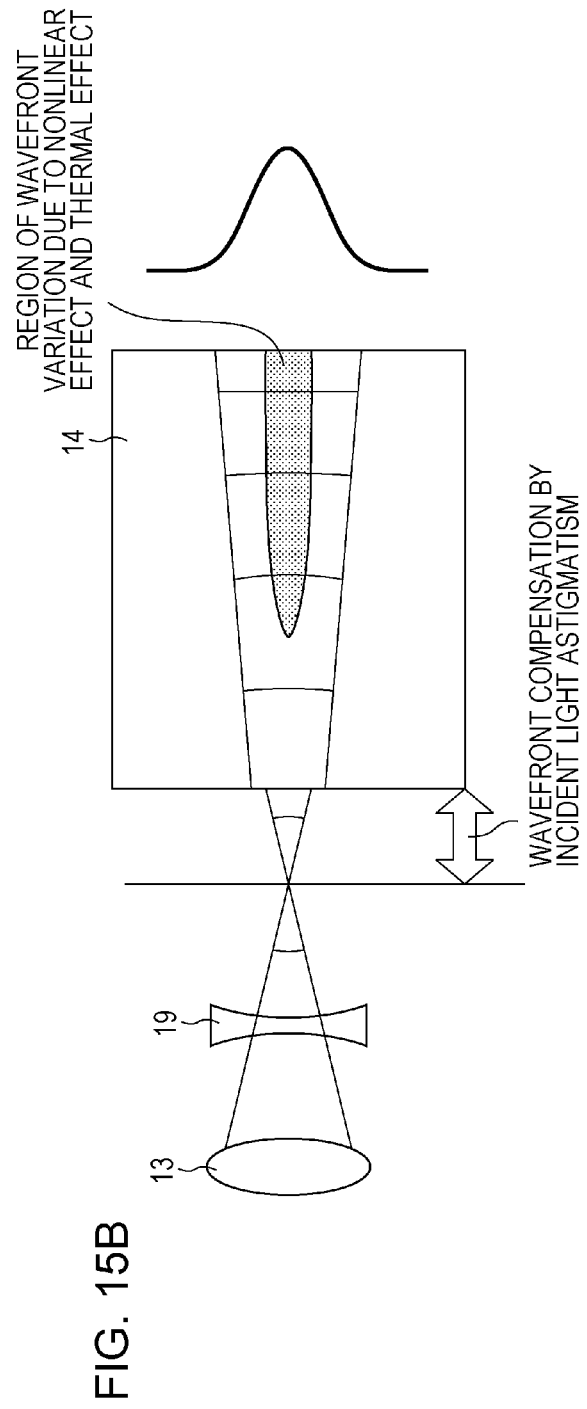

FIGS. 15A and 15B show a structure example for achieving wavefront compensation.

FIGS. 16A and 16B show a structure example 1 of a magnification conversion unit including cylinder lenses.

FIGS. 17A and 17B show a structure example 2 of the magnification conversion unit including cylinder lenses.

FIGS. 18A and 18B show a structure example 3 of the magnification conversion unit including cylinder lenses.

FIGS. 19A and 19B show a structure example of the magnification conversion unit including toric lenses.

Figure 20:
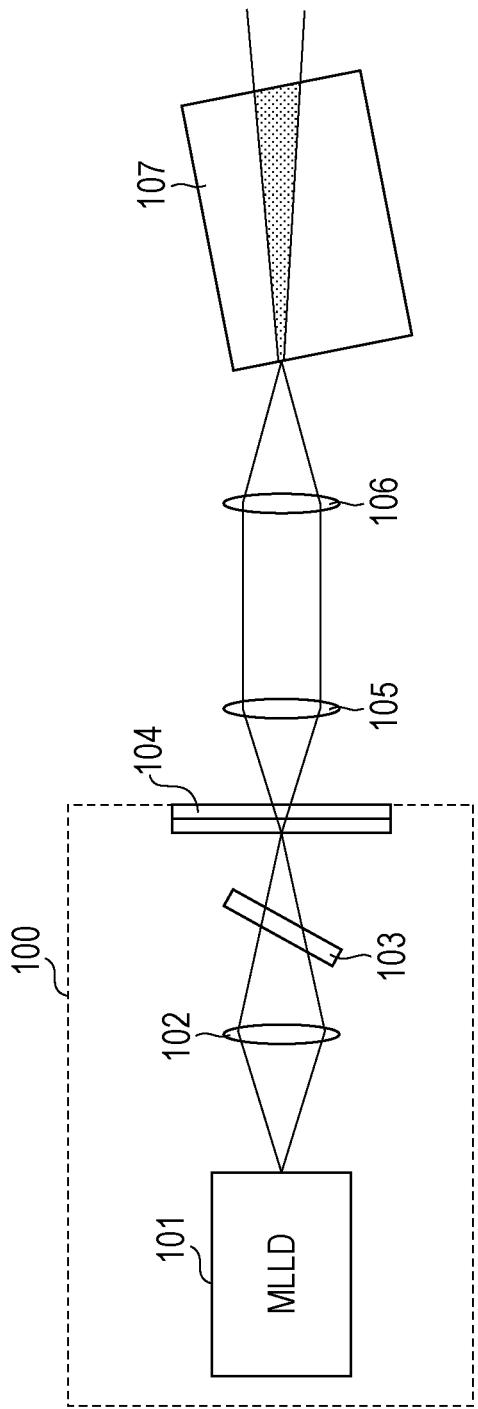

FIG. 20 illustrates the structure of a MOPA of the related art.

Figure 21:
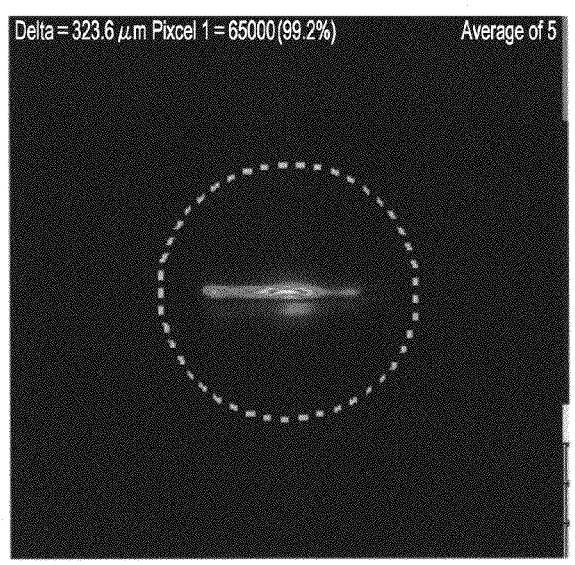

FIG. 21 shows a near-field image of the beam profile on the exit side of the SOA in the MOPA of the related art.

Figure 22A:
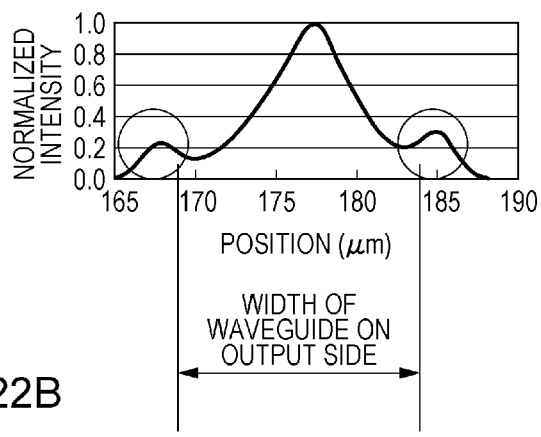
Figure 22B:
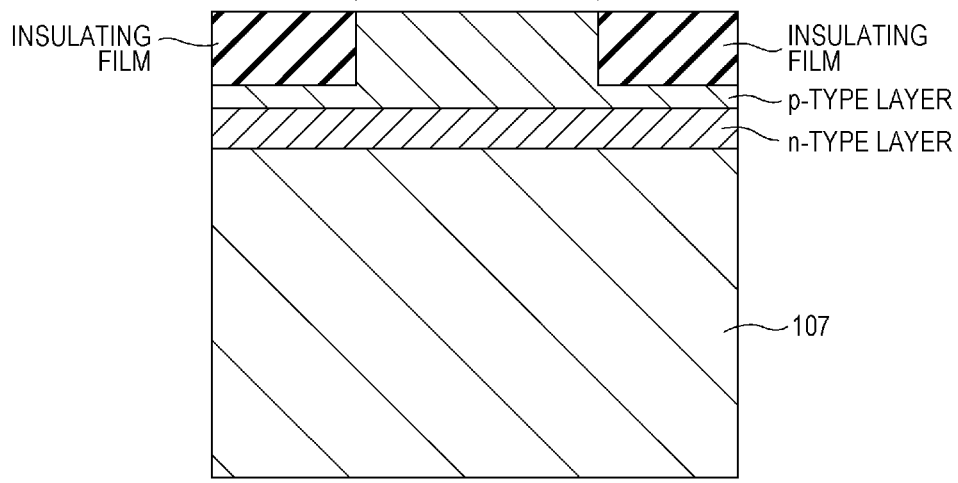

FIG. 22A shows the light intensity distribution in the horizontal lateral direction of output light from the SOA in the MOPA of the related art;

FIG. 22B shows a section of the waveguide on the exit side of the SOA.

DETAILED DESCRIPTION

An embodiment of the present application will be described in the order shown below.
<1. Entire Structure of a Recording Device>
<2. Structure of a MOPA>
<3. Ensuring a Single Peak>
<4. Variations in the Peak Position>
<5. Wavefront Compensation>
<6. Overview>
<7. Modifications>
<1. Entire Structure of a Recording Device>

Figure 1:
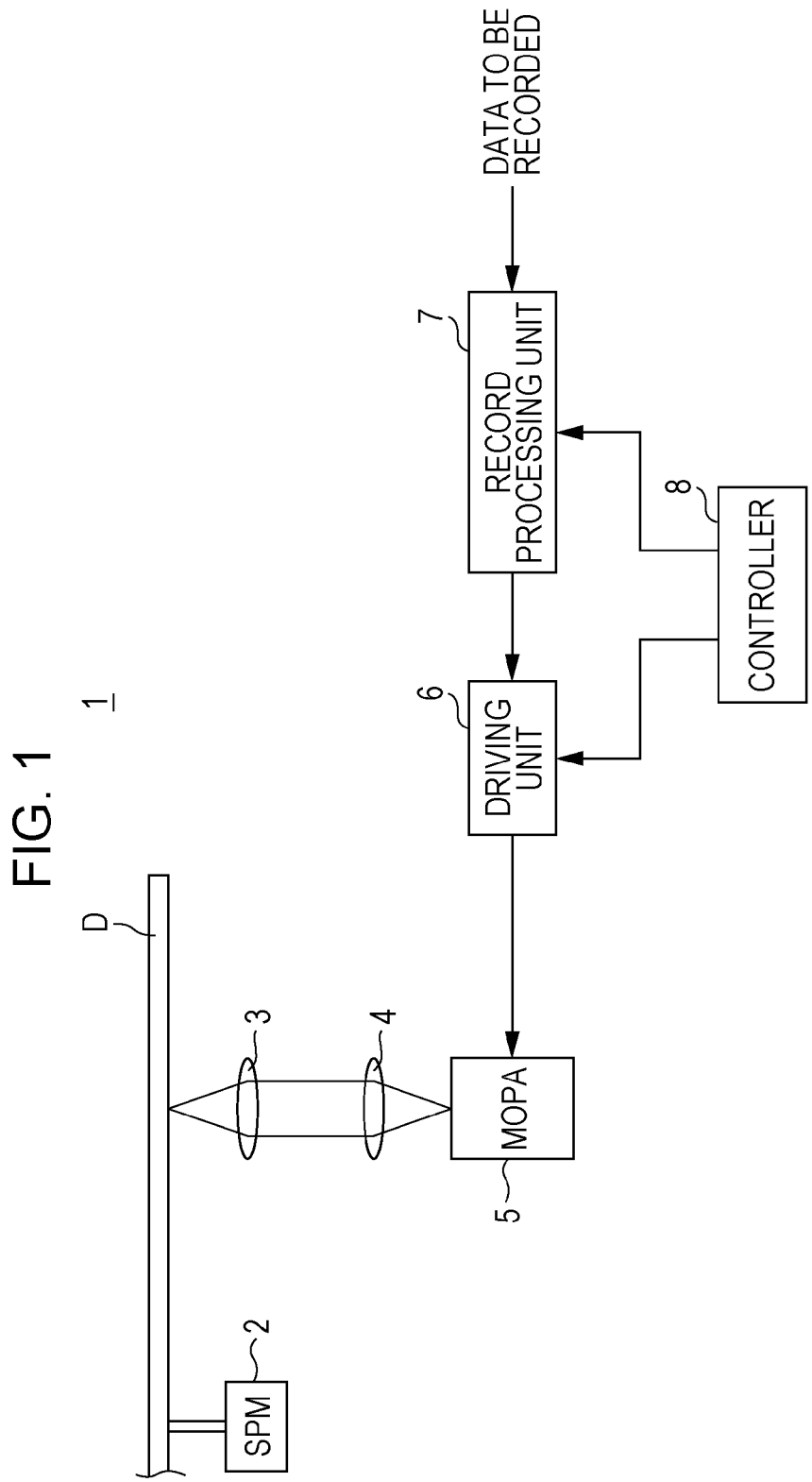
FIG. 1 shows the internal structure of a recording device according to an embodiment.

FIG. 1 shows the internal structure of a recording device (referred to below as a recording device 1) according to an embodiment of the present application.

In FIG. 1, the recording device 1 according to the embodiment includes at least a spindle motor (SPM) 2, an objective lens 3, a collimation lens 4, a MOPA (master oscillator power amplifier) 5, a driving unit 6, a record processing unit 7, and a controller 8.

The recording device 1 is configured so as to be able to at least record data on the optical disc D in the drawing. The optical disc D is a circular optical recording medium. The optical recording medium records or replays information by irradiation with light.

When mounted in the recording device 1, the optical disc D is rotated by the spindle motor 2 in a predetermined rotation control method such as constant linear velocity control.

As an optical system and light source for recording on the optical disc D, which is rotated and driven in this way, at least the objective lens 3, the collimation lens 4, and the MOPA 5 are provided.

The optical system including the objective lens 3 and the collimation lens 4 is incorporated in an optical pickup. The MOPA 5 may be incorporated in the optical pickup or only an SOA (semiconductor optical amp) 14, which will be described later, in the MOPA 5 may be incorporated in the optical pickup.

The MOPA 5 emits laser light based on a driving signal from the driving unit 6. The laser light exiting the MOPA 5 is collimated by the collimation lens 4 and led to the objective lens 3. The objective lens 3 focuses the laser light led in this way on a recording surface of the optical disc D.

Data to be recorded is input to the record processing unit 7.

The record processing unit 7 obtains modulated data by applying predetermined recording modulation encoding to data to be recorded.

The driving unit 6 receives the modulated data generated by the record processing unit 7 and drives the MOPA 5 using a driving signal generated according to the modulated data. As driving signals for the MOPA 5, a driving signal for letting an MLLD (a mode locked laser diode, also referred to as a mode locked laser) 15, which will be described later, emit and a driving signal for letting the SOA 14 perform light amplification modulation according to a row of modulated data are supplied.

The controller 8 includes a micro computer having, for example, a CPU (central processing unit), a ROM (read only memory), a RAM (random access memory), etc. and totally controls the recording device 1.

For example, the controller 8 instructs the record processing unit 7 to start recording or instructs the spindle motor 2 to start, stop, accelerate, or decelerate rotation. The controller 8 can also control the driving unit 6.

<2. Structure of a MOPA>

Figure 2:
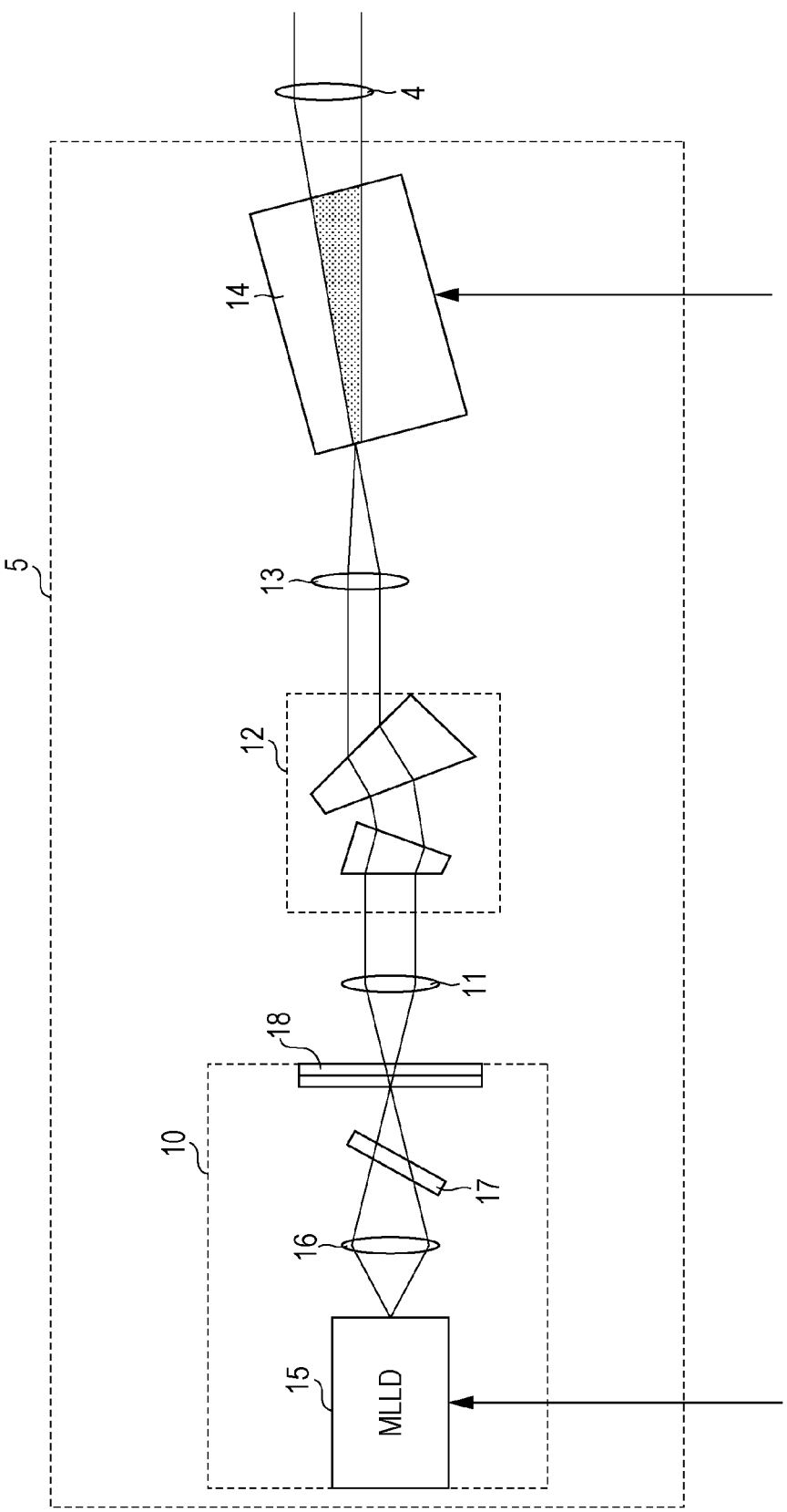
FIG. 2 shows the internal structure of a MOPA included in the recording device according to the embodiment.

FIG. 2 shows the internal structure of the MOPA 5 included in the recording device 1 according to the embodiment.

FIG. 2 is a top view illustrating the internal structure of the MOPA 5. That is, this drawing shows the section in the stripe direction.

FIG. 2 also shows the collimation lens 4, which is shown in FIG. 1.

As shown in the drawing, the MOPA 5 includes an MLLD unit 10, a collimation lens 11, an anamorphic prism 12, a focusing lens 13, and an SOA 14.

The MLLD unit 10 includes an MLLD 15 as a semiconductor laser, and an external resonator having a focusing lens 16, a band pass filter (BPF) 17, and a resonant mirror 18.

As shown in the drawing, exit light from the MLLD 15 is focused on the reflection surface of the resonant mirror 18 depending on the focusing lens 16.

In this example, the exit light from the MLLD 15 has a wavelength of approximately 403 nm.

The exit light from the MLLD unit 10 is obtained after passing through the resonant mirror 18 and the exit light enters the collimation lens 11 as diverging light and is collimated by the collimation lens 11.

The light that exits the MLLD unit 10 and is collimated by the collimation lens 11 is focused by the focusing lens 13 at the incident end (entrance) of the SOA 14 after passing through the anamorphic prism 12.

The anamorphic prism 12 will be described later.

The SOA 14 amplifies and modulates the laser light incident through the focusing lens 13 based on the driving signal from the driving unit 6 shown in FIG. 1 and outputs it.

In this example, a GaN (gallium nitride) SOA is used as the SOA 14 and exit light has a wavelength of approximately 402 nm (for single output without coupling with incident light to MLLD).

Also in this example, the peak power of output light from the SOA 14 after being coupled with incident light from the MLLD unit 10 is approximately 100 W.

As shown in the drawing, the exit light from the SOA 14 is input to the collimation lens 4 as the exit light from the MOPA 5.

<3. Ensuring a Single Peak>

Figure 3A:
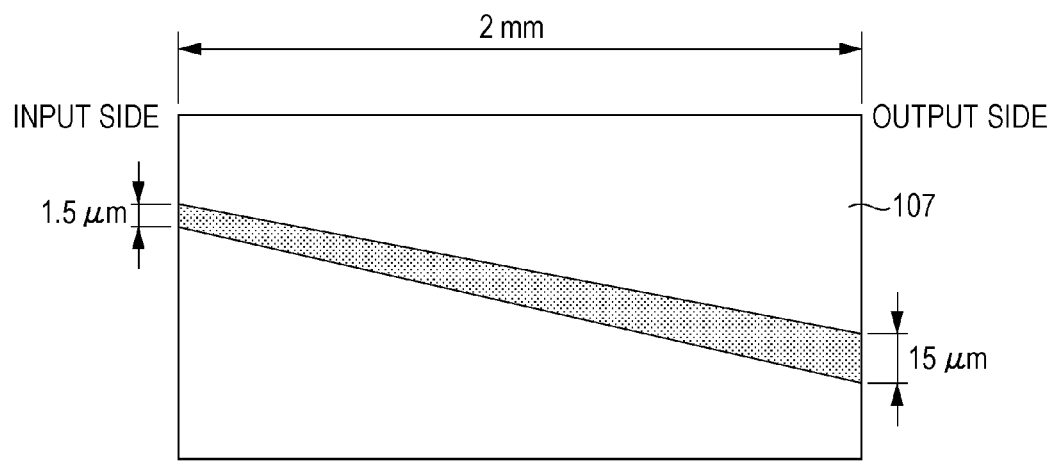
FIG. 3A shows the dimensions of individual parts of an SOA in a MOPA of the related art.
Figure 3B:
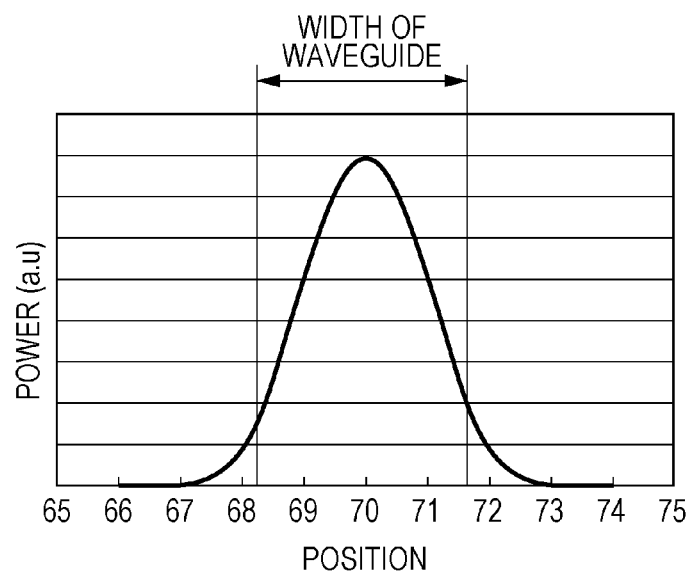
FIG. 3B shows the basic mode of the waveguide of the SOA.

FIG. 3A shows the dimensions of parts of the SOA 107 in a MOPA of the related art; FIG. 3B shows the basic mode of the waveguide of the SOA 107 that corresponds to the dimensions.

FIG. 3A is a top view of the SOA 107 as in FIG. 2 above. Simulation of the basic mode shown in FIG. 3B has been performed by the equivalent refractive index method.

As shown in FIG. 3A, the SOA 107 of the related art has a waveguide length (length in the travel direction of light) of 2 mm, an incident side stripe width (width in the incident side horizontal lateral direction) of 1.5 μm, and an exit side stripe width of 15 μm.

As shown in the drawing, the waveguide is tapered so that a 5° gradient is formed with respect to the end face of the SOA 107.

In this case, the effective refractive index (equivalent refractive index) is 2.518 and the refractive index difference is 0.01.

In the SOA 107 of the related art for which the waveguide dimensions are specified as described above, the basic mode in the horizontal lateral direction slightly leaks from the waveguide as shown in FIG. 3B.

FIG. 4 shows a lateral direction beam profile on the exit side of the SOA 107 when no light is input externally, or optical coupling with the MLLD unit 10 as the master laser is not performed. In other words, this is the lateral direction beam profile of light when the SOA 107 emits the light in a stand-alone basis.

It is found from FIG. 4 that there are three peaks in stead of one peak in the horizontal lateral mode in the SOA 107 of the related art.

It can be seen from this result in FIG. 4 and the simulation result in FIG. 3B that the reason why there is more than one peak in the intensity distribution of light on the exit side of the SOA 107 of the related art is because there is a leakage in the basic mode.

Accordingly, it is sufficient to improve the light confinement in the basic mode defined by the waveguide on the incident side of the SOA so that only one peak appears. This means the enlargement of the width in the lateral direction of the waveguide on the incident side of the SOA.

Figure 5A:
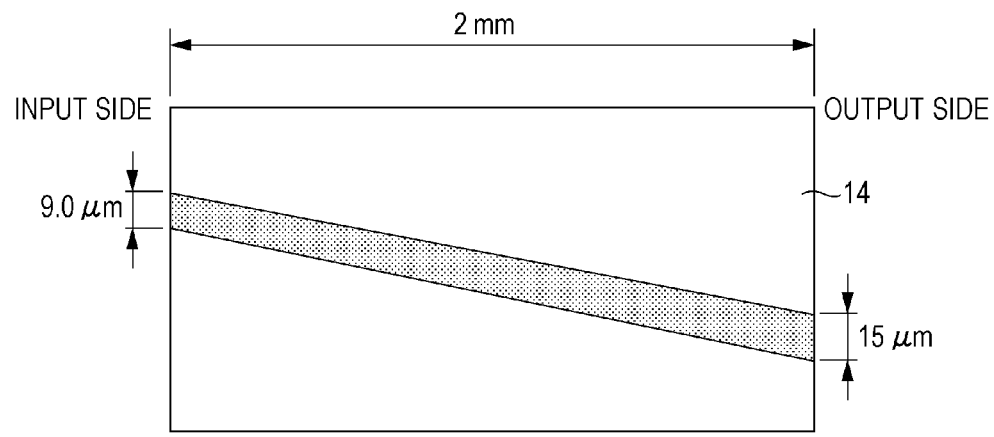
FIG. 5A shows the dimensions of individual parts of an SOA in the MOPA of the embodiment.

FIG. 5A shows the dimensions of parts of the SOA 14 according to the embodiment in which the width in the lateral direction of the waveguide on the incident side has been enlarged.

As shown in FIG. 5A, the width in the lateral direction of the waveguide on the incident side of the SOA 14 in this example is enlarged to 9.0 μm from 1.5 μm, which is the width in the SOA 107 of the related art.

The length (2 mm) of the waveguide, the width (15 μm) in the horizontal lateral direction of the waveguide on the exit side, and the taper angle are the same as in the SOA 107.

In this case, the effective refractive index (equivalent refractive index) of the waveguide is 2.5199 and the refractive index difference is 0.01.

Figure 5B:
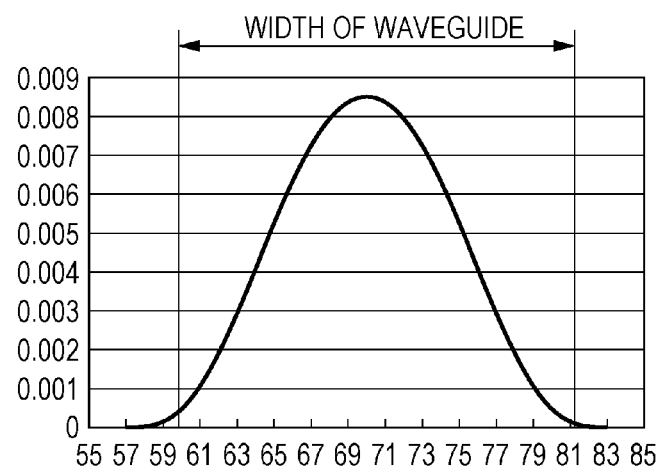
FIG. 5B shows the basic mode of the waveguide of the SOA.

FIG. 5B shows the basic mode in the waveguide of the SOA 14 in this example shown in FIG. 5A. Simulation in this case is also performed by the equivalent refractive index method.

It is found from the result in FIG. 5B that a leakage of the horizontal lateral mode to the waveguide is sufficiently suppressed.

Figure 6:
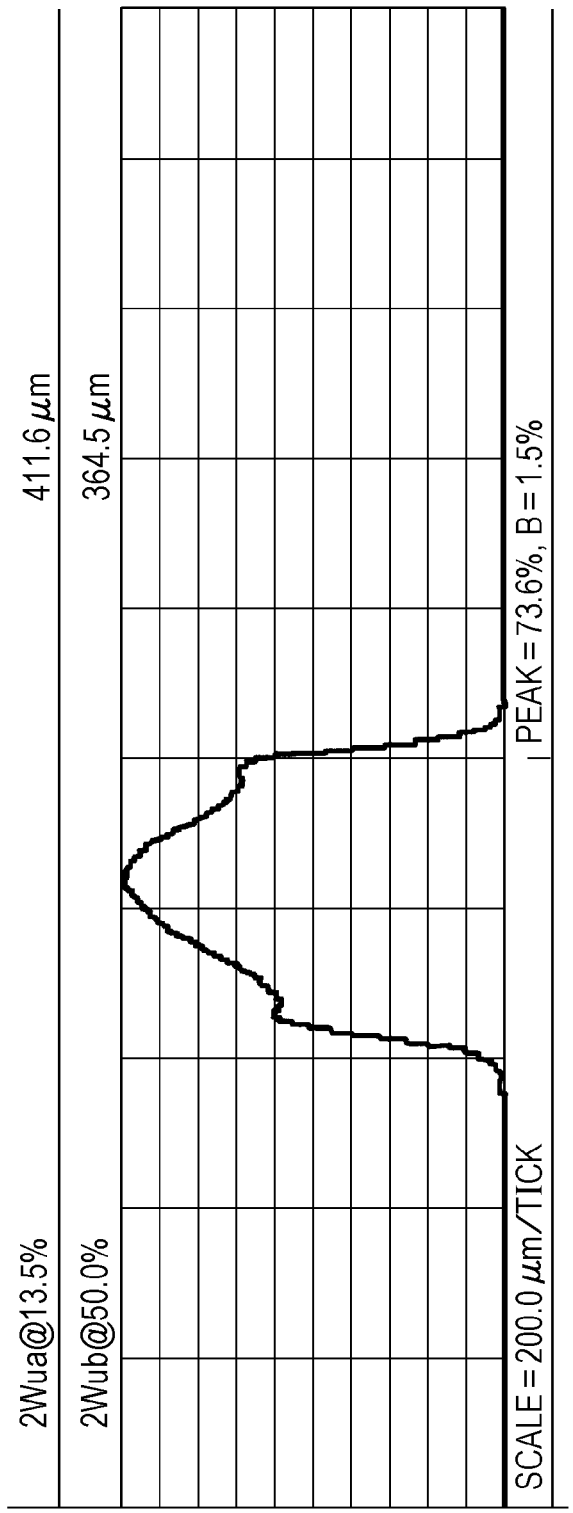
FIG. 6 shows a lateral direction beam profile on the exit side of the SOA in the embodiment in a state in which optical coupling with the master laser is not performed.

FIG. 6 shows a lateral direction beam profile on the exit side of the SOA 14 in this example in a state in which optical coupling with the master laser (MLLD unit 10) is not performed.

It is found from FIG. 6 that the SOA 14 in this example, which has a wider waveguide on the incident side than in the related art, ensures that only one peak appears in the intensity distribution of exit light in the lateral direction when the SOA 14 emits light on a stand-alone basis.

The refractive index difference between the inside and outside of the waveguide relates to light confinement in the horizontal lateral direction; this refractive index difference is controlled by the depth of an etching outside the ridge, exactly by the remaining thickness of the semiconductor layer between the active layer and the insulating film.

Figure 7A:
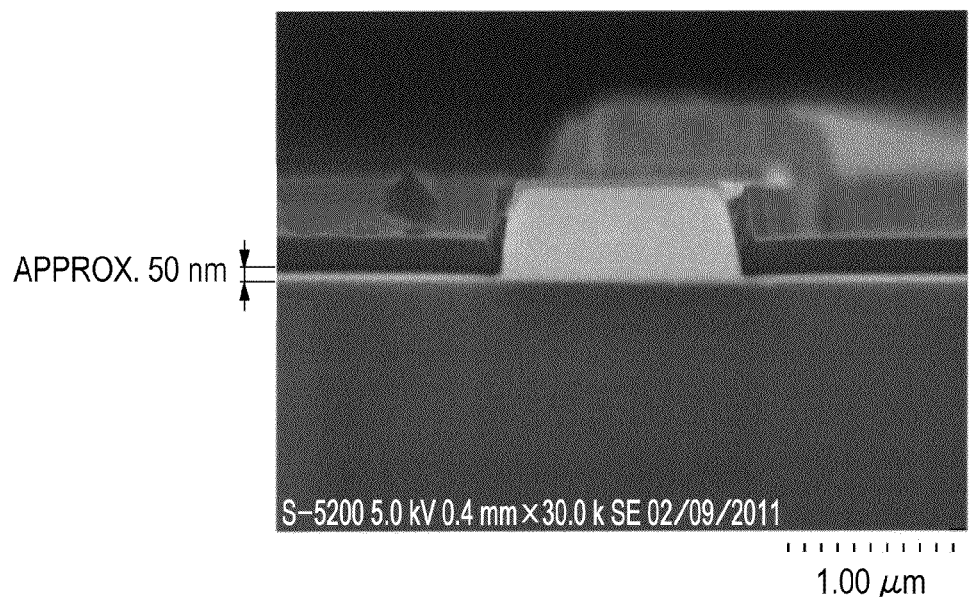
FIG. 7A shows the SEM image of an end face on an incident side of the SOA of the related art.
Figure 7B:
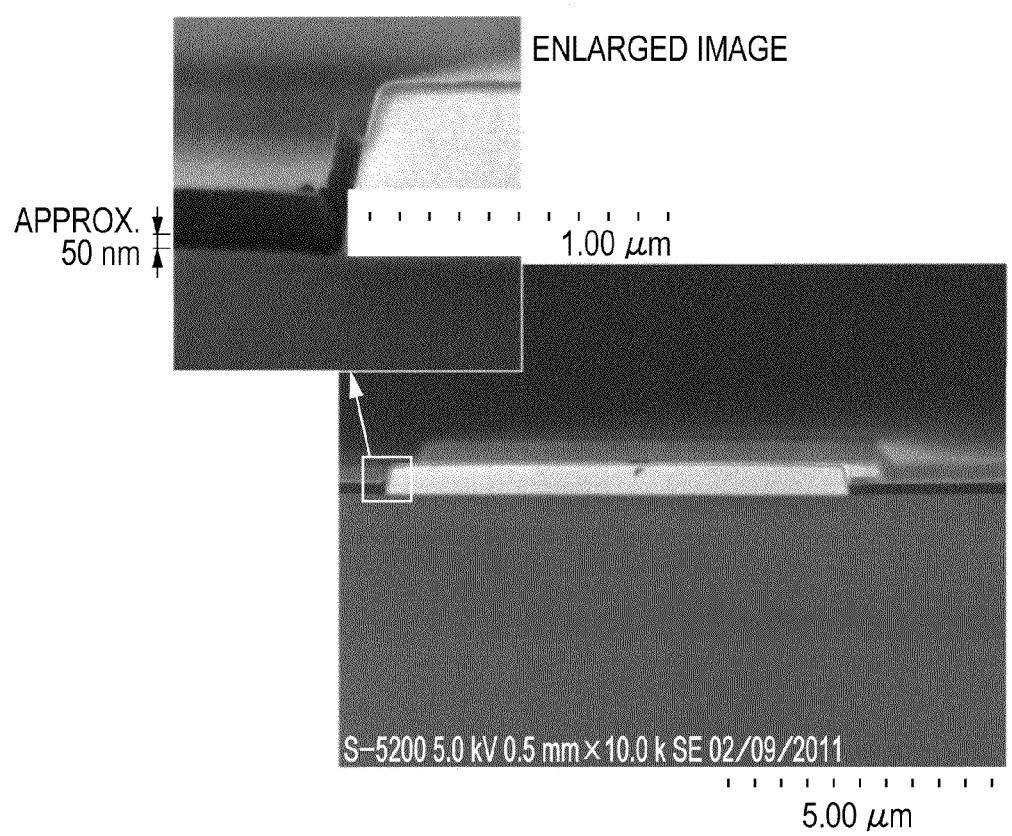
FIG. 7B shows the SEM image of an end face on the incident side of the SOA according to the embodiment.
Figure 8:
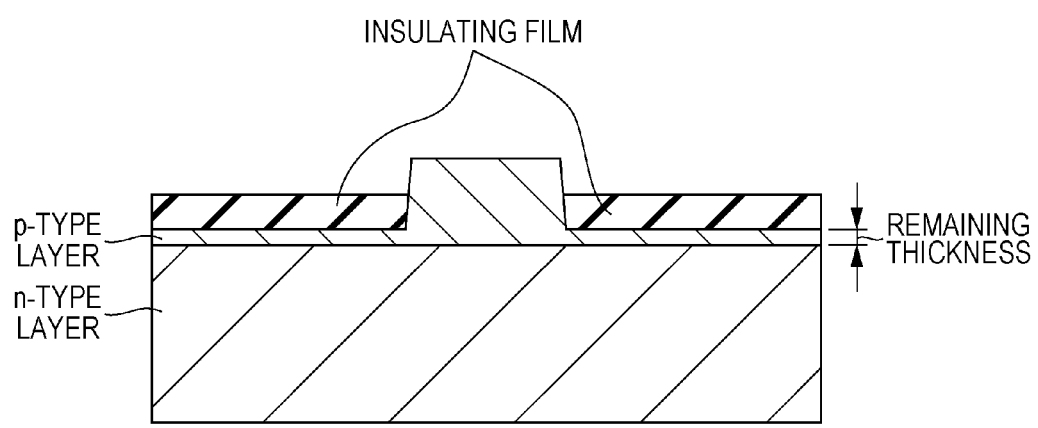
FIG. 8 is a schematic view of the SEM images shown in FIGS. 7A and 7B.

FIG. 7A shows the SEM image of the end face on an incident side of the SOA 107 of the related art in FIG. 3A; FIG. 7B shows the SEM image of the end face on the incident side of the SOA 14 in this example in FIG. 5A. FIG. 8 schematically shows the SEM images in FIGS. 7A and 7B for reference.

In FIGS. 7A, 7B, and 8, it is found that the remaining thicknesses in the drawings are both approximately 50 mm and there is not a large difference in the refractive index between these layers. Accordingly, it is found that the width of the waveguide on the incident side relates to the ensuring of a single peak.

Figure 9:
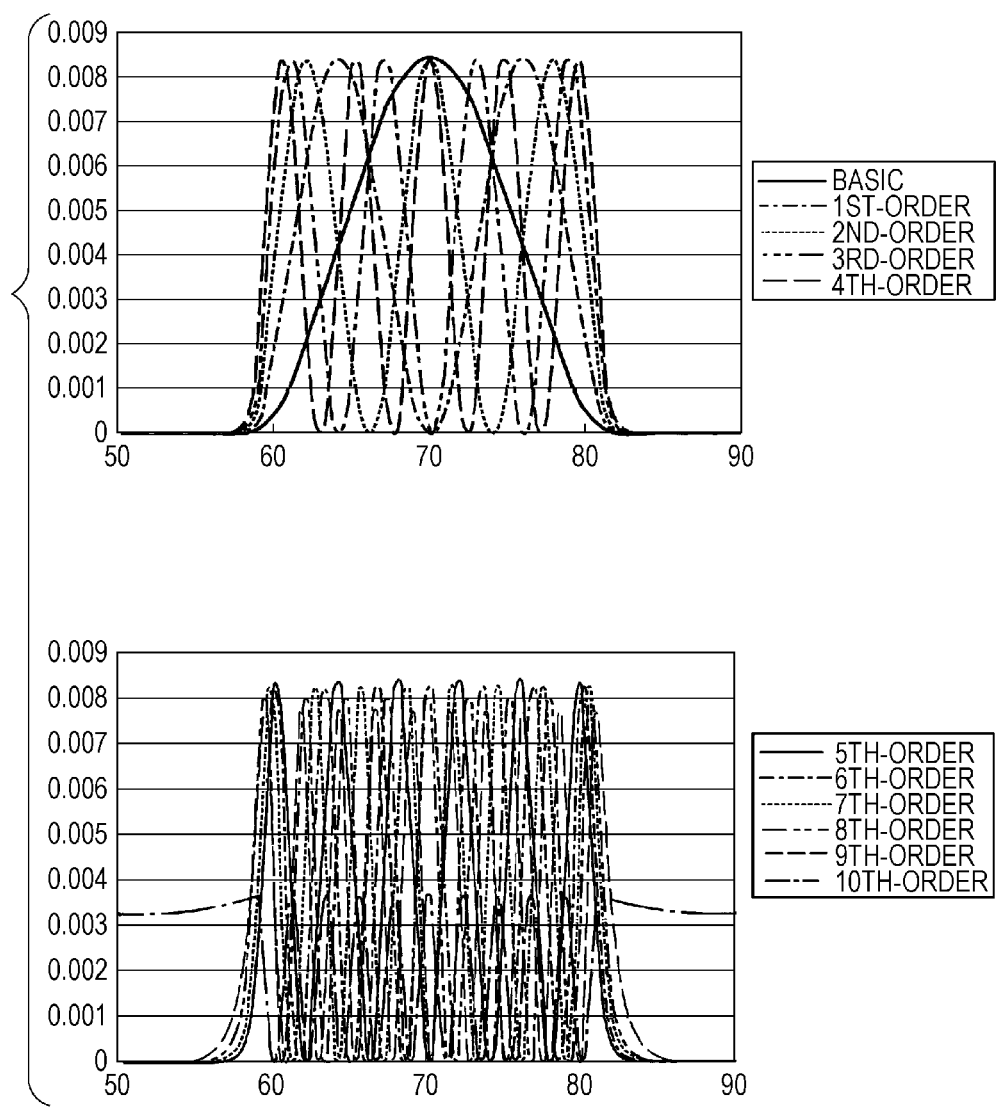
FIG. 9 shows all waveguide modes of the waveguide of the SOA according to the embodiment.

FIG. 9 shows all waveguide modes of the waveguide of the SOA 14 in this example. In this drawing, the basic mode and the first-order to fourth-order modes are indicated as one graph; the fifth-order to tenth-order modes are indicated as another graph.

In FIG. 9, it is found that multiple modes appear because the width of the waveguide on the incident side is increased in the SOA 14 in this example.

Accordingly, for the SOA 14 in this example, even if optical coupling is obtained when light from the MLLD unit 10 as the master laser is input, coupling with a mode other than the basic mode, which is a higher-order mode, has been performed.

Figure 10:
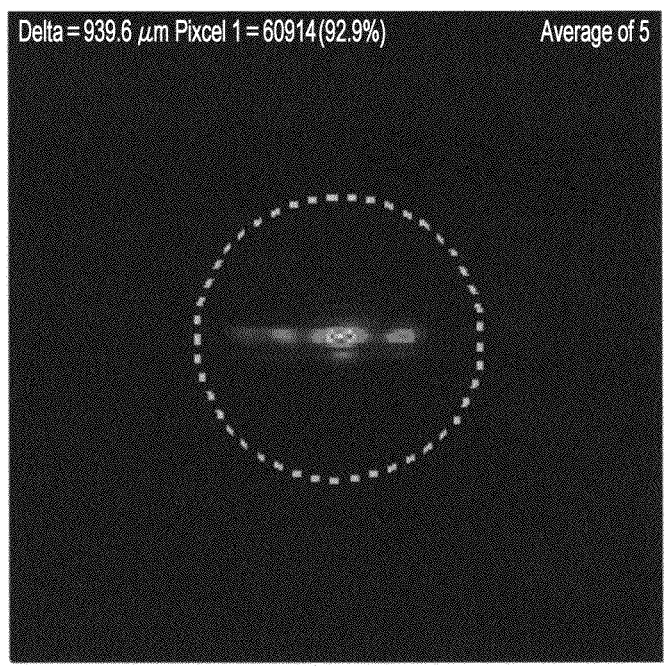
FIG. 10 shows a near-field image (after optical coupling with a master laser) on an exit side of the SOA when only the width of an incident end of the SOA is changed.

FIG. 10 shows a near-field image (after optical coupling with the master laser) on the exit side of the SOA when only the width of the incident end of the SOA is changed. More specifically, this is the near-field image on the exit side in the case where the SOA 107 is replaced with the SOA 14 in this example in the structure of the MOPA of the related art shown in FIG. 20.

In FIG. 10, it is found that increasing the width of the incident end of the SOA is not enough to prevent coupling in a higher mode. This is because the inner product of a higher mode (second-order mode is dominant) becomes large as indicated by expression (1) due to mismatch between the size of a light beam input externally and the basic mode size of the waveguide on the incident side of the SOA 14.

Accordingly, the MOPA 5 according to the embodiment is configured so that exit light from the MLLD unit 10 is changed in magnification and is incident on the SOA 14.

More specifically, in this example, the anamorphic prism 12 shown in FIG. 2 is inserted so that exit light from the MLLD unit 10 is magnification-converted and is incident on the SOA 14.

Since the width of the waveguide on the incident side of the SOA 14 is increased from 1.5 μm to 9.0 μm in this example, the magnification is set to 6.

In this case, it should be noted that this type of magnification conversion by the anamorphic prism 12 is performed in the lateral direction (stripe direction), not in the longitudinal direction (junction direction). This is also obvious from the arrangement of the anamorphic prism 12 shown in FIG. 2 (top view).

This type of magnification conversion allows the incident light from the MLLD unit 10 as the master laser to selectively excite the basic mode of the SOA 14.

Each of FIGS. 11A and 11B shows the beam profile of a near-field image on the exit side of the SOA 14 when magnification conversion has been performed. FIG. 11A shows the profile in the lateral direction; FIG. 11B shows the profile in the longitudinal direction for reference. Solid lines indicate actual profiles and dotted lines indicate Gaussian fitting.

In the results in FIGS. 11A and 11B, it is found that the basic mode of the SOA 14 is selectively excited by the above magnification conversion.

When the basic mode of the SOA 14 is selectively excited as described above, the light intensity distribution of output light (that is, output light from the entire MOPA 5) from the SOA 14 obtained by coupling of incident light from the MLLD unit 10 also has only one peak.

<4. Variations in the Peak Position>

In the present embodiment for which the width of the waveguide on the incident side of the SOA 14 is increased as described above and the magnification of incident light from the master laser has been converted, variations in the near-field image on the exit side of the SOA can also be suppressed.

The suppression of variations can be described as follows, but it is difficult to directly illustrate its effects in a drawing.

FIG. 12 shows the amplification ratio of the SOA 107 of the related art to the input light intensity of the master laser when using the SOA 107 shown in FIG. 3A. More specifically, this graph represents the pulse ratio (indicated by ■) and average SOA light output (indicated by ◆) with respect to the average amount of incident light (horizontal axis).

In FIG. 12, the occurrence of the saturation of magnification ratio, or the saturation of gain is found with reference to the dimensions of the waveguide of the SOA 107 of the related art shown in FIG. 3A.

On the other hand, FIG. 13A shows the optical spectrum of the master laser light; FIG. 13B shows the optical spectrum on the exit side of the SOA 107.

It can be seen from FIGS. 13A and 13B that the peak wavelength and line width have been increased. This indicates the appearance of a nonlinear optical effect referred to as self phase modulation (see "Ultra-High Speed Optical Device" by Fujio Saitoh, Kyoritsu Shuppan).

If the width of the waveguide on the incident side is increased as in the SOA 14 in this example shown in FIG. 5A and a magnification conversion unit is provided to increase the magnification of incident light from the master laser (in other words, to increase the spot size of incident light from the master laser), the density of input light to the SOA 14 can be reduced.

This reduces the density of light in the waveguide of the SOA 14 and reduces the nonlinear optical effect, thereby improving the stability of the peak position of a beam.

<5. Wavefront Compensation>

In this example, the SOA 14 amplifies output light so that it has a peak power of 100 W, which is a relatively high intensity.

In this case, wavefront aberration tends to occur in output light from the SOA 14 due to the nonlinear optical effect described above and thermal modulation of refractive index (so-called a thermal lens effect, which is also referred to below as a thermal effect) in the SOA 14.

In the structure of the MOPA 5 in the embodiment described above, even when wavefront aberration caused by such nonlinear effects and thermal effects occurs, the aberration can be easily corrected. This will be described with respect to FIGS. 14A to 15B.

FIGS. 14A and 14B are used to describe wavefront aberration caused by nonlinear effects and thermal effects. FIG. 14A shows a state in which there is no wavefront aberration; FIG. 14B shows a state in which wavefront aberration has occurred.

In the SOA 107 of the related art, the optical system is designed so that the basic mode determined by the stripe width at the input end is selected. This basic mode should be propagated ideally in the same phase (FIG. 14A). However, when nonlinear effects or convergence effects caused by thermal effects are present during propagation as shown in FIG. 14B, in the related art in which the basic mode is selected as described above, it is very difficult to correct these effects.

On the other hand, when using a structure in which the width of waveguide on the incident side is increased as in the present embodiment, convergence effects can be canceled depending on the structure of an optical system that is the previous phase of the SOA 14.

FIGS. 15A and 15B show a structure example for achieving wavefront compensation; FIG. 15A is a side view (in the junction direction) and FIG. 15B is a top view (in the stripe direction).

When, for example, a cylinder lens 19 is inserted between the focusing lens 13 and the SOA 14 as shown in FIGS. 15A and 15B, astigmatism is given to incident light to the SOA 14. That is, this intentionally causes a deviation of the focusing point in the stripe direction. If convergence is caused by nonlinear effects or thermal effects in the SOA 14, the wavefront can be compensated, thereby achieving the desired wavefront of an output beam from the MOPA 5.

A hologram element can be also used in place of the cylinder lens 19 to obtain the same effect.

Not limiting the size of the incident end to the basic mode size unlike the MOPA of the related art enables the wavefront of output light from the MOPA to be controlled, achieving the compensation of the wavefront.

The same thing can be achieved by making parallel laser light incident on the focusing lens 13 to slightly divergent.

Arbitrary compensation is enabled by inserting an element for generating an arbitrary wavefront including a hologram element or an arbitrary aspheric optical element into the incident side of the SOA 14, other than giving astigmatism.

Alternatively, it is also possible to make the waveguide in the SOA 14 taper-angle-shaped, curved, or lens-shaped, compensate the wavefront of incident light from the master laser side by combination of the anamorphic prism 12 and a lens accordingly, thereby making the shape of the wavefront of an output beam from the MOPA 5 a desired one.

<6. Overview>

As described above, in this embodiment, the width in the lateral direction of the waveguide on the incident side of the SOA 14 is enlarged so that the horizontal lateral mode of the waveguide on the incident side of the SOA 14 becomes multiple modes. This improves the light confinement in the basic mode defined by the width of the waveguide of the incident side of the SOA 14 and ensures that only one peak appears in the intensity distribution of output light when the SOA 14 emits light on a stand-alone basis.

In addition, this embodiment provides a magnification conversion unit as the anamorphic prism 12 so that the basic mode is selectively excited in optical coupling on the incident side of the SOA 14. This ensures that only one peak appears in the intensity distribution of the output light (exit light from SOA 14 after optical coupling with the MLLD unit 10) from the MOPA 5.

The above-described conversion of the magnification of incident light from the MLLD unit 10 means the enlargement of the spot size of the incident light. Accordingly, the density of light in the waveguide of the SOA 14 is reduced and variations caused by nonlinear optical effects (self phase modulation) of the SOA 14 in the peak of an exit beam are thereby suppressed.

As described above, according to the embodiment, if the exit beam of a light source device as a MOPA has only one peak, variations in the peak position can be suppressed. As a result, good and stable performance can be obtained as an optical device, particularly as a recording device for optical recording.

According to the present embodiment, which is unlike the related art and the incident end of the SOA 14 is allowed to have a size other than the basic mode size, control of the wavefront of exit light from the MOPA 5 caused by thermal lens effects etc. of the SOA 14 can be made easily and more proper wavefront compensation can be performed.

It has been confirmed that the problem of having more than one peak in the distribution of exit beam intensity and the problem of variations become more pronounce under conditions that the MOPA exit laser power is 50 W or more, the repetition frequency is hundreds of megahertz or more, the pulse width is tens of picoseconds or less, and the laser wavelength is 550 nm or less. Accordingly, the present application is particularly suitable for the system that meets these conditions.

<7. Modifications>

The embodiment of the present application was described above, but the present application is not limited to these specific examples.

For example, an example of setting the width of the waveguide on the incident side of the SOA 14 to 9 μm was provided above, but this is only an example and the width of the waveguide on the incident side of the SOA 14 can be set as appropriate within the range in which the horizontal lateral mode of the waveguide on the incident side becomes multiple modes. Similarly, the magnification of the conversion of the size of an incident beam from the master laser (MLLD unit 10) is selected as appropriate from the beam size of the master laser and the beam size of the basic mode defined by the width of the waveguide on the incident side of the SOA 14.

The internal structure (optical system) of the MOPA is not limited to this example and may be a structure considered to be optimum in which, for example, a half wavelength plate is added for adjustment of the polarization direction, according to actual embodiment.

In addition, the indicated pulse laser wavelength is only an example and another embodiment is possible.

A cylinder lens or toric lens may be used in place of the anamorphic prism 12 for magnification conversion.

Examples of the structure of the magnification conversion unit when using a cylinder lens or toric lens will be described below with reference to FIGS. 16A, 16B, 17A, 17B, 18A, 18B, 19A, and 19B.

FIGS. 16A, 16B, 17A, 17B, 18A, and 18B show examples of the structure that use cylinder lenses. FIGS. 16A and 16B are a structure example 1; FIGS. 17A and 17B are a structure example 2; FIGS. 18A and 18B are a structure example 3. FIGS. 16A, 17A, 18A, and 19A are top views (in the stripe direction); FIGS. 16B, 17B, 18B, and 19B are side views (in the junction direction).

In structure example 1 shown in FIGS. 16A and 16B, the magnification conversion unit including cylinder lenses 20 and 21 is inserted between the collimation lens 11 and the focusing lens 13.

The focal length of the cylinder lens 20 placed closer to the collimation lens 11 is assumed to be fx1 and the focal length of the cylinder lens 21 placed closer to the focusing lens 13 is assumed to be fx2 as shown in the drawings, magnification m in the lateral direction set by the magnification conversion unit in this case is calculated by m=fx1/fx2.

In structure example 2 shown in FIGS. 17A and 17B, the magnification conversion unit including the cylinder lens 20 (convex lens) and the cylinder lens 21 (concave lens) is inserted between the collimation lens 11 and the focusing lens 13.

The focal length of the cylinder lens 20 placed closer to the collimation lens 11 is assumed to be fx1 and the focal length of a cylinder lens 22 placed closer to the focusing lens 13 is assumed to be fx2 as shown in the drawings, magnification m in the lateral direction set by the magnification conversion unit in structure example 2 is calculated by m=fx1/−fx2.

In structure example 3 shown in FIGS. 18A and 18B, the focusing lens 13 is omitted.

In structure example 3, the cylinder lens 20 and a cylinder lens 23 are placed between the collimation lens 11 and the SOA 14. In this case, the cylinder lens 20 closer to the collimation lens 11 is placed so as to function as a convex lens only in the stripe direction as in FIGS. 16A to 17B; the cylinder lens 23 closer to the SOA 14 is placed so as to function as a convex lens only in the junction direction.

If the focal length of the cylinder lens 20 is assumed to be fx and the focal length of the cylinder lens 23 is assumed to be fy as shown in the drawings, magnification m by the magnification conversion unit is calculated by m=fx/fy. That is, the magnification in the longitudinal direction is 1 as before and magnification m by the magnification conversion unit is calculated by m=fx/fy.

FIGS. 19A and 19B are a structure example in which a toric lens is used.

In this example, the focusing lens 13 is omitted as in FIGS. 18A and 18B. In addition, the cylinder lens 23 that is the same as in FIGS. 18A and 18B and functions as a convex lens only in the junction direction is disposed in the position closer to the collimation lens 11. Then, a toric lens 24 is disposed in the position closer to the SOA 14.

It is assumed that the focal length in the junction direction of the cylinder lens 23 is fy1, the focal length in the stripe direction of the toric lens 24 is fx2, and the focal length in the junction direction of the toric lens 24 is fy2. If the synthetic focal length of fy1 and fy2 is fy, magnification m in this case is calculated by m=fx2/fy as shown in the drawings.

Examples of applying this application to a recording system (optical recording system) using an optical recording medium are described in the above description, but application of this application is not limited to an optical recording system.

For example, in the bioimaging field, there is an optical microscope system that uses a pulse laser as the light source. This application is preferably applicable to other optical systems such as this type of optical microscope system, for example. In an optical microscope system, since the optical performance degrades as in an optical recording system if exit light from SOA has a plurality of peaks or there are variations in the peak position, the present application is effectively applicable for improvement.

An embodiment of the present application may have structures described in (1) to (4) below.

(1)

A light source device configured as a MOPA (master oscillator power amplifier) including a mode locked laser unit having an external resonator and a semiconductor optical amplifier that amplifies and modulates laser light emitted from the mode locked laser unit wherein the width in a lateral direction of a waveguide on an incident side of the semiconductor optical amplifier is set so that a horizontal lateral mode of waveguide on the incident side of the semiconductor optical amplifier becomes multiple modes, and a magnification conversion unit that converts a magnification of incident light from the mode locked laser unit to the semiconductor optical amplifier is disposed so that a basic mode is selectively excited in optical coupling on the incident side of the semiconductor optical amplifier.

(2)

The light source device according to (1) wherein the magnification conversion unit includes an anamorphic prism, a cylindrical lens, or a toric lens to convert the magnification.

(3)

The light source device according to (1) or (2) wherein aberration for compensating a wavefront of output light from the semiconductor optical amplifier is given to incident light from the mode locked laser unit to the semiconductor optical amplifier.

(4)

The light source device according to any one of (1) to (3) wherein the semiconductor optical amplifier is a GaN semiconductor optical amplifier.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light source device configured as a master oscillator power amplifier comprising:
   a mode locked laser unit having an external resonator and emitting a laser light; and
   a semiconductor optical amplifier that amplifies and modulates laser light emitted from the mode locked laser unit, the semiconductor optical amplifier including a waveguide having a width in a lateral direction on an incident side of the semiconductor optical amplifier, the width being set so that a horizontal lateral mode of the waveguide on the incident side of the semiconductor optical amplifier becomes multiple modes; and
   a magnification conversion unit that is configured to magnify convert incident light from the mode locked laser unit to the semiconductor optical amplifier and is disposed so that a basic mode of the multiple modes is selectively excited when the magnification conversion unit is optically coupled to the incident side of the semiconductor optical amplifier.

2. The light source device according to claim 1 wherein the magnification conversion unit includes an anamorphic prism, a cylindrical lens, or a toric lens to convert the magnification.

3. The light source device according to claim 1 wherein aberration for compensating a wavefront of output light from the semiconductor optical amplifier is given to incident light from the mode locked laser unit to the semiconductor optical amplifier.

4. The light source device according to claim 1 wherein the semiconductor optical amplifier is a GaN semiconductor optical amplifier.

5. The light source device according to claim 1, wherein the width in the lateral direction of the waveguide on the incident side of the semiconductor optical amplifier is larger than a width in a lateral direction of a waveguide on an exit side of the mode locked laser.

6. An optical pickup comprising:
   a light source unit configured as a master oscillator power amplifier including
   i) a mode locked laser unit having an external resonator and emitting a laser light, and
   ii) a semiconductor optical amplifier that amplifies and modulates laser light emitted from the mode locked laser unit and includes a waveguide having a width in a lateral direction on an incident side of the semiconductor optical amplifier, the width being set so that a horizontal lateral mode of the waveguide on the incident side of the semiconductor optical amplifier becomes multiple modes; and
   an objective lens that directs laser light emitted from the light source unit to an optical recording medium;
   wherein the light source unit has a magnification conversion unit that is configured to magnify convert incident light from the mode locked laser unit to the semiconductor optical amplifier and is disposed so that a basic mode of the multiple modes is selectively excited when the magnification conversion unit is optically coupled to the incident side of the semiconductor optical amplifier.

7. A recording device comprising:
   a light source unit configured as a master oscillator power amplifier including
   i) a mode locked laser unit having an external resonator and emitting a laser light, and
   ii) a semiconductor optical amplifier that amplifies and modulates laser light emitted from the mode locked laser unit and includes a waveguide having a width in a lateral direction on an incident side of the semiconductor optical amplifier, the width being set so that a horizontal lateral mode of the waveguide on the incident side of the semiconductor optical amplifier becomes multiple mode; and
   a recording control unit that drives the light source device to record information in an optical recording medium;
   wherein the light source unit has a magnification conversion unit that is configured to magnify convert incident light from the mode locked laser unit to the semiconductor optical amplifier and is disposed so that a basic mode of the multiple modes is selectively excited when the magnification conversion unit is optically coupled to the incident side of the semiconductor optical amplifier.

* * * * *